(12) United States Patent
Park et al.

(10) Patent No.: US 12,167,629 B2
(45) Date of Patent: Dec. 10, 2024

(54) DISPLAY DEVICE

(71) Applicant: SAMSUNG DISPLAY CO., LTD., Yongin-si (KR)

(72) Inventors: Jong-Ryuk Park, Yongin-si (KR); Keun Soo Lee, Yongin-si (KR); Sun Youl Lee, Yongin-si (KR); Yun-Mo Chung, Yongin-si (KR); Jae Beom Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/355,080

(22) Filed: Jul. 19, 2023

(65) Prior Publication Data

US 2023/0363198 A1    Nov. 9, 2023

Related U.S. Application Data

(63) Continuation of application No. 17/242,614, filed on Apr. 28, 2021, now Pat. No. 11,751,424, which is a
(Continued)

(30) Foreign Application Priority Data

Mar. 23, 2015  (KR) .................. 10-2015-0040308

(51) Int. Cl.
*H10K 50/844* (2023.01)
*H10K 50/842* (2023.01)
(Continued)

(52) U.S. Cl.
CPC ....... *H10K 50/844* (2023.02); *H10K 50/8426* (2023.02); *H10K 59/131* (2023.02);
(Continued)

(58) Field of Classification Search
CPC .... H10K 71/00; H10K 77/111; H10K 71/851; H10K 2102/00; H10K 2102/311;
(Continued)

(56) References Cited

U.S. PATENT DOCUMENTS 5,757,450 A    5/1998  Fujii et al.
7,280,178 B2  10/2007  Hashimoto
(Continued)

FOREIGN PATENT DOCUMENTS

KR    10-2006-0087724    8/2006
KR    10-2008-0097984    11/2008
(Continued)

OTHER PUBLICATIONS

Office Action dated Jun. 8, 2021 of the corresponding Korean Patent Application No. 10-2015-0040308, 6 pages (in Korean).

*Primary Examiner* — Galina G Yushina
(74) *Attorney, Agent, or Firm* — CHAU & ASSOCIATES, LLC (57) ABSTRACT

A display device includes a substrate including a display area in which a plurality of pixels is disposed, and a non-display area in a peripheral area of the display area; an insulating layer disposed on the substrate; a metal wiring disposed on the substrate; and a plurality of dummy patterns disposed in the non-display area of the substrate. The plurality of dummy patterns includes a plurality of first patterns including an insulating material and a plurality of second patterns including a metal material.

12 Claims, 12 Drawing Sheets

Related U.S. Application Data continuation of application No. 16/449,672, filed on Jun. 24, 2019, now Pat. No. 11,024,829, which is a continuation of application No. 15/070,361, filed on Mar. 15, 2016, now Pat. No. 10,333,102.

(51) Int. Cl.
  *H10K 59/131* (2023.01)
  *H10K 59/88* (2023.01)
  *H10K 71/00* (2023.01)
  *H10K 77/10* (2023.01)
  *H10K 59/12* (2023.01)
  *H10K 102/00* (2023.01)

(52) U.S. Cl.
  CPC ............. *H10K 59/88* (2023.02); *H10K 71/00* (2023.02); *H10K 77/111* (2023.02); *H10K 59/1201* (2023.02); *H10K 71/851* (2023.02); *H10K 2102/00* (2023.02); *H10K 2102/311* (2023.02); *Y02E 10/549* (2013.01)

(58) Field of Classification Search
  CPC ............. H10K 50/844; H10K 50/8426; H10K 59/131; H10K 59/88; H10K 59/124; H10K 59/1201; Y02E 10/549; G09F 9/301
  See application file for complete search history.

(56) References Cited

U.S. PATENT DOCUMENTS

| | | | |
|---|---|---|---|
| 10,216,023 B2 | 2/2019 | Namkung et al. | |
| 10,333,102 B2 | 6/2019 | Park et al. | |
| 10,962,814 B2 | 3/2021 | Namkung et al. | |
| 11,024,829 B2 | 6/2021 | Park et al. | |
| 2005/0140290 A1 | 6/2005 | Park et al. | |
| 2008/0239188 A1* | 10/2008 | Jung | G02F 1/1339 |
| | | | 438/30 |
| 2012/0313914 A1* | 12/2012 | Matsumoto | H01J 11/12 |
| | | | 345/60 |
| 2014/0211117 A1 | 7/2014 | Choi et al. | |
| 2014/0217397 A1* | 8/2014 | Kwak | H01L 27/124 |
| | | | 257/43 |
| 2014/0232956 A1* | 8/2014 | Kwon | H01L 27/124 |
| | | | 349/12 |
| 2014/0326965 A1 | 11/2014 | Cho et al. | |
| 2015/0034935 A1 | 2/2015 | Choi | |
| 2015/0060778 A1* | 3/2015 | Kim | H10K 59/873 |
| | | | 438/23 |
| 2015/0060893 A1 | 3/2015 | Cho et al. | |
| 2015/0091030 A1* | 4/2015 | Lee | H10K 50/844 |
| | | | 438/34 |
| 2015/0162392 A1 | 6/2015 | Lim et al. | |
| 2016/0013253 A1 | 1/2016 | Lee | |
| 2016/0060778 A1 | 3/2016 | Kim et al. | |
| 2016/0093685 A1 | 3/2016 | Kwon et al. | |
| 2016/0285044 A1 | 9/2016 | Park et al. | |
| 2019/0319216 A1 | 10/2019 | Park et al. | |
| 2021/0249630 A1 | 8/2021 | Park et al. | |

FOREIGN PATENT DOCUMENTS

| | | |
|---|---|---|
| KR | 10-2009-0121894 | 11/2009 |
| KR | 10-2011-0015205 | 2/2011 |
| KR | 10-2013-0035593 | 4/2013 |
| KR | 10-2014-0045836 | 4/2014 |
| KR | 10-2014-0061897 | 5/2014 |
| KR | 10-2015-0015257 | 2/2015 |

* cited by examiner

DISPLAY DEVICE

CROSS-REFERENCE TO RELATED APPLICATION

This application is a continuation of U.S. application Ser. No. 15/070,361 filed on Mar. 15, 2016, U.S. application Ser. No. 16/449,672 filed on Jun. 24, 2019, and U.S. application Ser. No. 17/242,614 filed on Apr. 28, 2021, which claim priority under 35 U.S.C. § 119 of Korean Patent Application No. 10-2015-0040308 filed on Mar. 23, 2015, the disclosure of each of these applications are incorporated by reference herein.

FIELD

Background

The present disclosure relates to a display device.

Description of the Related Technology

As the manufacturing technology for a display device, such as for example an organic light emitting device and a liquid crystal display, has developed, the display device has been made relatively thinner.

When the display device is thin, if an external force is continuously applied to the display device, physical damage is caused outside the display device such that a crack is generated, the crack is propagated into a display area from the outside through an insulating layer, and a moisture-permeable path is formed along the crack propagation path, thereby causing defects such as, for example, pixel shrinkage.

The above information disclosed in this Background section is only to enhance the understanding of the background of the invention, and therefore it may contain information that does not form the prior art that is already known in this country to a person of ordinary skill in the art.

SUMMARY OF CERTAIN INVENTIVE ASPECTS

The present disclosure provides a display device capable of preventing an externally generated crack from being propagated into the display area even when the display device is thin.

A display device according to an embodiment includes a substrate including a display area in which a plurality of pixels is disposed and a non-display area in a peripheral area of the display area; an insulating layer disposed on the substrate; a metal wiring disposed on the substrate; and a plurality of dummy patterns disposed in the non-display area of the substrate, wherein the plurality of dummy patterns includes a plurality of first patterns including an insulating material and a plurality of second patterns including a metal material.

The display device may be flexible or curved.

The plurality of first patterns and the plurality of second patterns may be alternately disposed.

At least one of the plurality of the second patterns may be disposed at side edges of the non-display area, and the plurality of first patterns may be disposed between the second pattern disposed at both side edges of the non-display area.

At least one of the plurality of the first patterns may be disposed at side edges of the non-display area, and the plurality of second patterns may be disposed between the first patterns disposed at both side edges of the non-display area.

The plurality of first patterns may be formed of the same layer as the insulating layer and the plurality of second patterns may be formed of the same layer as the metal wiring.

The plurality of first patterns may be disposed around a single second pattern.

The plurality of first patterns and the plurality of second patterns may each be alternately disposed.

The insulating layer may include at least one of silicon nitride (SiNx) or silicon oxide (SiO2).

The display device may further include a barrier layer disposed on the substrate.

The insulating layer and the metal wiring may be disposed on the barrier layer.

The barrier layer may include at least one of silicon nitride (SiNx) or silicon oxide (SiO2).

The plurality of dummy patterns may have a slit shape.

The plurality of dummy patterns may have a protruding pattern having a wave shape that is continuously curved.

The plurality of dummy patterns may have a chevron cross-sectional shape of a continuous "V".

A method for producing a display device according to one embodiment may include: disposing the plurality of pixels on the display area of the substrate such that the non-display area is formed in the peripheral area of the display area; disposing the insulating layer on the substrate; disposing the metal wiring on the substrate; and disposing the plurality of dummy patterns in the non-display area of the substrate.

The method may further include alternately disposing the plurality of first patterns and the plurality of second patterns.

The method may further include disposing a barrier layer on the substrate.

The insulating layer and the metal wiring may be disposed on the barrier layer.

According to an embodiment of the display device, although the display device becomes thin, an externally generated crack may be prevented from spreading to the display area.

DETAILED DESCRIPTION OF CERTAIN INVENTIVE EMBODIMENTS

The present disclosure will be described more fully hereinafter with reference to the accompanying drawings, in which certain embodiments are shown. As those skilled in the art would realize, the described embodiments may be modified in various ways, without departing from the spirit or scope of the present invention.

In the drawings, the thickness of layers, films, panels, regions, and the like, may be exaggerated for clarity. Like reference numerals generally designate like elements throughout the specification.

The drawings are schematic, and are not illustrated in accordance with a scale. Relative dimensions and ratios of portions in the drawings may be illustrated to be exaggerated or reduced in size for clarity and convenience, and the dimensions are just examples and are not limiting.

It will be understood that when an element such as a layer, film, region, or substrate is referred to as being "on" another element, it can be directly on the other element, or intervening elements may also be present. In contrast, when an element is referred to as being "directly on" another element, there are no intervening elements present.

A display device according to an embodiment will be described with reference to FIG. 1 to FIG. 3.

Figure 1:
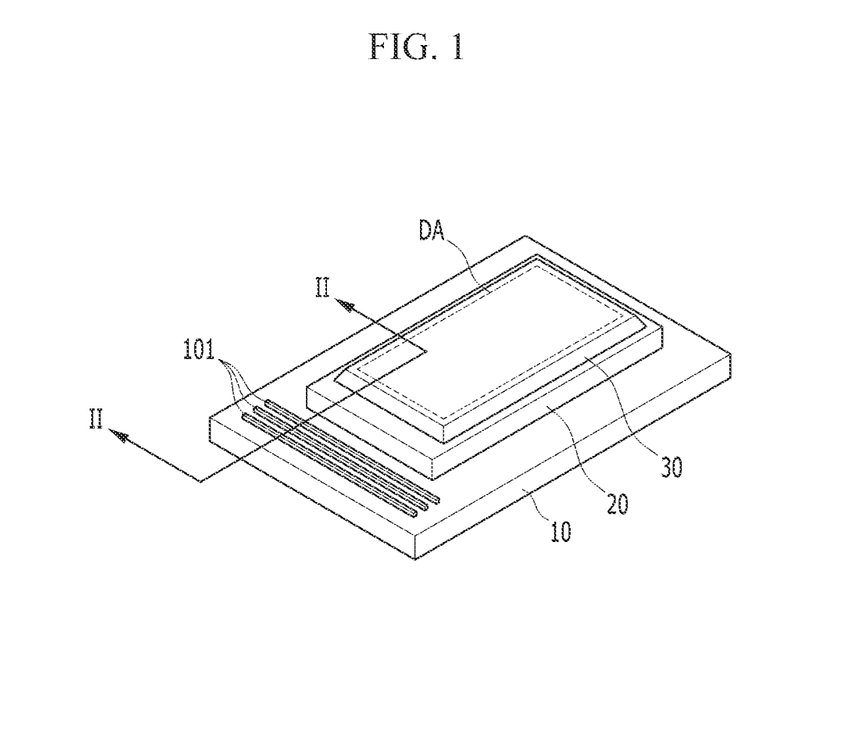
FIG. 1 is a schematic perspective view of a display device according to an embodiment.
Figure 2:
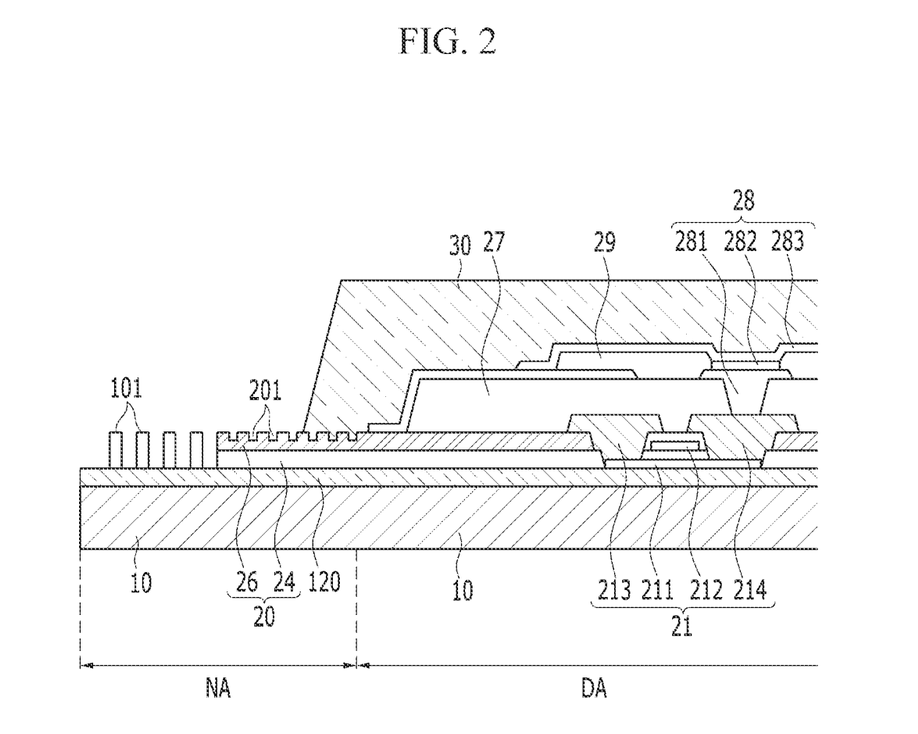
FIG. 2 is a cross-sectional view taken along line II-II of FIG. 1.
Figure 3:
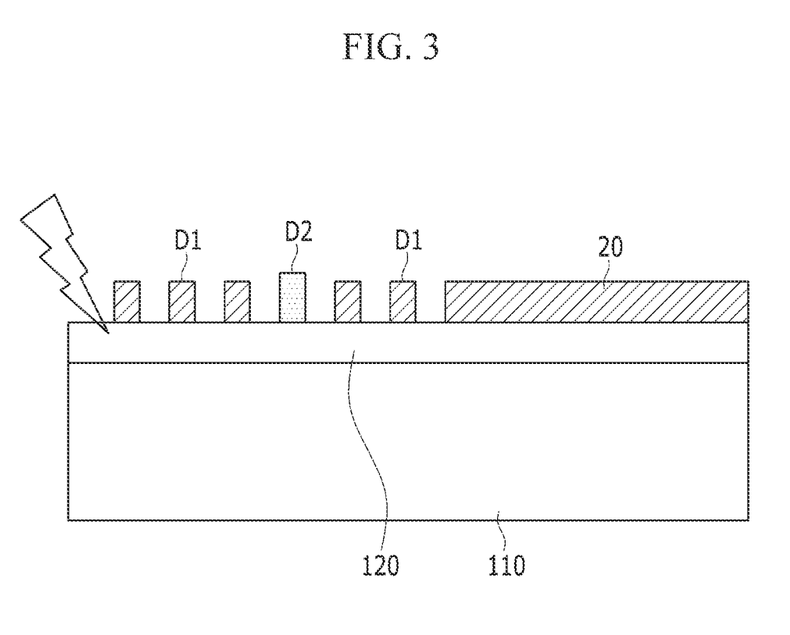
FIG. 3 is a cross-sectional view of a part of a display device according to an embodiment.

FIG. 1 is a schematic perspective view of a display device according to an embodiment, FIG. 2 is a cross-sectional view taken along line II-II of FIG. 1, and FIG. 3 is a cross-sectional view of a part of a display device according to an embodiment.

Referring to FIG. 1 and FIG. 2, a display device includes a display substrate 10, an inorganic layer 20 disposed on the display substrate 10, and a thin film encapsulation layer 30 disposed on the inorganic layer.

The display device includes a display area DA in which a plurality of pixels is disposed, and a non-display area NA positioned near the display area DA.

A barrier layer 120 is disposed on the substrate 10. The barrier layer 120 is disposed in the display area DA and the non-display area NA. However, according to another embodiment, the barrier layer 120 may be disposed in only the display area DA.

The barrier layer 120 prevents an impurity from being diffused into the display area DA though the substrate 10 and flat a surface thereof. The barrier layer 120 may include at least one of a silicon nitride (SiNx) layer, a silicon oxide (SiO$_2$) layer, or a silicon oxynitride (SiO$_x$N$_y$) layer. However, the barrier layer 120 is not a required configuration, and may be omitted according to a kind of the display substrate and a process condition.

A driving semiconductor layer 211 is disposed on the barrier layer 120 positioned at the display area DA.

The driving semiconductor layer 211 includes a polysilicon layer and includes a channel region in which impurities are not doped, and a source region and a drain region in which the impurities are doped at respective sides of the channel region.

A driving gate electrode 212 is disposed on the driving semiconductor layer 211, and a first insulating layer 24 is disposed on the driving gate electrode 212. The first insulating layer 24 may be a gate insulating layer covering the driving gate electrode 212 of the thin film transistor 21.

The first insulating layer 24 has a through-hole exposing the source region and the drain region of the driving semiconductor layer 211. A data wire including a driving source electrode 213 and a driving drain electrode 214 is disposed on the first insulating layer 24. The driving source electrode 213 and the driving drain electrode 214 are respectively connected to the source region and the drain region through the through-hole formed in the first insulating layer 24.

The driving semiconductor layer 211, the driving gate electrode 212, the driving source electrode 213, and the driving drain electrode 214 form a driving thin film transistor 21, and the thin film transistor 21 is a driving switching element. Although not shown, the display device according to an embodiment may further include a switching thin film transistor as a switching element.

The switching thin film transistor is used as a switching element that selects a pixel for light emission, and the driving thin film transistor applies power for light emission of the selected pixel to the corresponding pixel. Herein, the pixel means a minimum light emitting unit for displaying an image.

The first insulating layer 24 may be an insulating layer such as silicon nitride (SiNx) or silicon oxide (SiO2).

A second insulating layer 26 is disposed on the gate electrode 212 and the data wire. The second insulating layer 26 may be an interlayer insulating layer covering the data wire to be insulated. The second insulating layer 26 may be the insulating layer such as silicon nitride (SiNx) or silicon oxide (SiO2).

Although not shown, a planarizing layer (not shown) may be disposed on the second insulating layer 26 disposed in the display area DA.

The planarizing layer has a function of removing a step to increase a light emission efficiency of an organic light emitting element of the light-emitting diode 28 to be planarized. The planarizing layer has a contact hole exposing a part of the driving drain electrode 214.

A protection layer 27 to protect the thin film transistor 21 is disposed on the planarizing layer. The protection layer 27 has an electrode contact hole exposing a part of the driving drain electrode 214.

A pixel electrode 281 is disposed on the driving drain electrode 214.

A pixel definition layer 29 is disposed on the pixel electrode 281, and an organic emission layer 282 is disposed in an opening region defined by the pixel definition layer 29. A common electrode 283 is disposed on the pixel definition layer 29 and the organic emission layer 282.

The pixel electrode 281, the organic emission layer 282, and the common electrode 283 form an organic light emitting diode 28.

One of the pixel electrode 281 and the common electrode 283 may be formed of a reflective layer, and the other may be formed of a semi-transmissive or transparent conductive layer. Light emitted from the organic emission layer 282 is reflected by the reflective layer and emitted to the outside through the transparent conductive layer. In the case of the transflective layer, the part of the light emitted from the organic emission layer 282 is again reflected to the reflective layer, thereby forming a resonance structure.

The thin film encapsulation layer 30 is disposed on the second insulating layer 26, thereby encapsulating the insulating layer 20 and the display area DA. An end surface of the thin film encapsulation layer 30 is retracted to the side of the display area DA rather than the end surface of the insulating layer 20, thereby forming a shape covering at least a portion of the insulating layer 20. Also, the thin film encapsulation layer 30 may be disposed by alternately depositing at least one organic layer and at least one inorganic layer. In this case, the inorganic layer or the organic layer may each be disposed in a plurality.

The organic layer includes a polymer, and may be a single layer of a laminated layer including any one of polyethylene terephthalate, polyimide, polycarbonate, epoxy, polyethylene, or polyacryl. The organic layer may include polyacrylate, and more specifically, may include a material in which a monomer composition including diacrylate-based monomers and triacrylate-based monomers are polymerized. Monoacrylate-based monomers may be further included in the monomer composition. Further, in the monomer composition, a known photoinitiator such as TPO may also be included, but embodiments are not limited thereto.

The inorganic layer may be a single layer or a laminated layer including metal oxide or metal nitride. The inorganic layer may include any one of SiNx, Al2O3, SiO2, or TiO2.

A top layer exposed to the outside in the thin film encapsulation layer 30 may be formed as an inorganic layer in order to prevent moisture from penetrating into the organic light emitting diode.

A halogenated metal layer containing hydrofluoric lithium (LiF) may be included between the display area DA and the inorganic layer, although it is not shown. The halogenated metal layer may prevent the display area DA from being damaged when forming the inorganic layer by a sputtering method or plasma deposit method.

A dummy pattern 101 is disposed in the non-display area NA. The dummy pattern 101 may prevent a crack from spreading toward the display area DA from the outside due to an external physical impact. The second insulating layer 26 may have a secondary dummy pattern 201 and the secondary dummy pattern 201 may be formed in the non-display area NA of the second insulating layer 26. The secondary dummy pattern 201 may block cracks spreading from the outside, together with the dummy pattern 101 and the second dummy pattern 201 secondarily prevents the cracks from spreading into the display area DA. The secondary dummy pattern 201 may be omitted.

The dummy pattern 101 according to an embodiment includes a first pattern made of the insulating material layer and a second pattern made of the metal layer. This will be described in detail with reference to FIG. 3.

According to the shown embodiment, the dummy pattern 101 is disposed with a slit shape in the same interval as the end surface, however the shape, the number, and the arrangement relation of the dummy pattern 101 are not limited thereto, a protruding pattern having a wave shape that is continuously curved or a chevron cross-sectional shape of a continuous "V" may be formed, the interval between the dummy patterns 101 may be random, and the shape thereof may be changed by the arrangement of the display area DA and the non-display area NA, the arrangement of the non-display area NA, the protrusion length of the end of the insulating layer 20, and the degree of the physical impact transmitted from the outside.

In the shown embodiment, the display area DA of the display device includes the plurality of pixels including the organic light emitting diode 28, however embodiments are not limited thereto, and, according to another embodiment, the display area DA may include the plurality of pixels having a liquid crystal layer.

Next, the dummy pattern 101 of the display device according to an embodiment will be described with reference to FIG. 3.

Referring to FIG. 3, the dummy pattern 101 of the display device according to an embodiment includes the first pattern D1 made of the insulating material layer and the second pattern D2 made of the metal layer.

The first pattern D1 is formed of the insulating material forming the insulating layer 20 disposed in the display area DA, and the second pattern D2 is formed of the metal material forming the gate electrode 212, the driving source electrode 213, and the driving drain electrode 214 disposed in the display area DA.

As shown in FIG. 3, the first pattern D1 is positioned from the outside of the display device, the second pattern D2 is positioned beside the first pattern D1, and the first pattern D1 is again positioned beside the second pattern D2.

Figure 4:
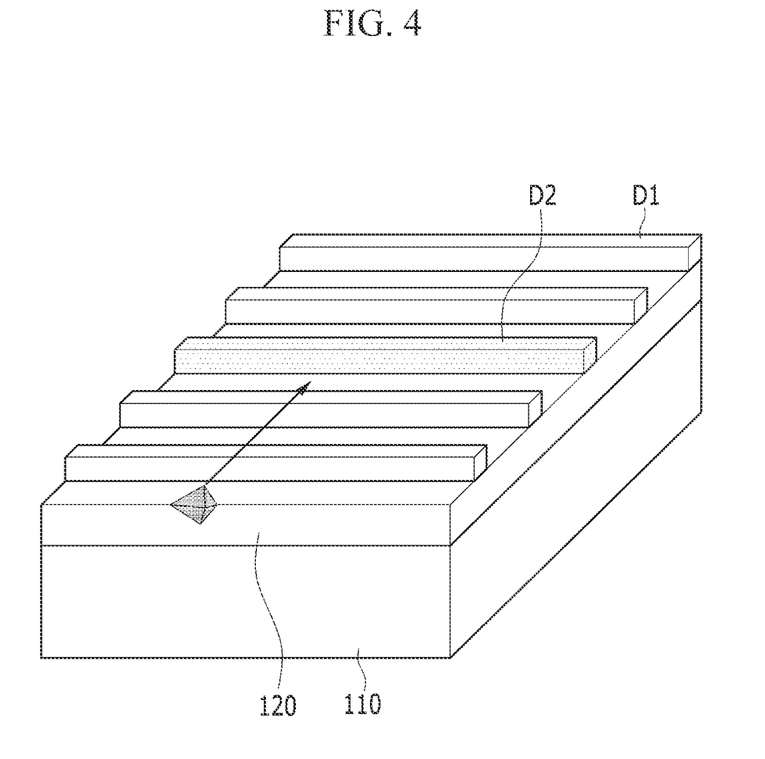
FIG. 4 and FIG. 5 are schematic views to explain a characteristic of a display device according to an embodiment.
Figure 5:
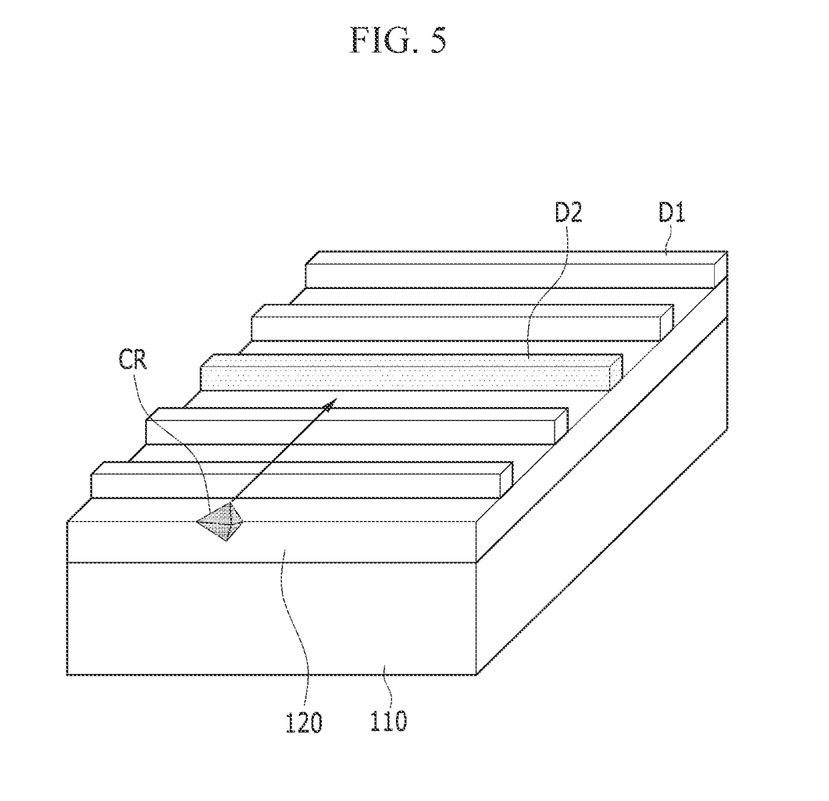

Next, a characteristic of the display device according to an embodiment will be described with reference to FIG. 4 and FIG. 5. FIG. 4 and FIG. 5 are schematic views to explain a characteristic of a display device according to an embodiment.

First, referring to FIG. 4, if the crack CR is generated outside the display device, as shown in FIG. 5, the crack CR may be diffused to the side of the display area DA along the barrier layer 120 acting as the insulating layer. Thus, if the crack CR is generated, the crack CR may also be spread to the first pattern D1 made of the insulating material like the barrier layer 120. However, the second pattern D2 disposed beside the first pattern D1 is formed of a tighter metal material than the insulating material, thereby preventing the spread of the crack CR.

Accordingly, according to the display device according to an embodiment, the dummy pattern 101 includes the first pattern D1 made of the insulating material layer and the second pattern D2 made of the metal layer, thereby preventing the externally generated crack CR from spreading to the display area DA. On the other hand, according to a conventional display device only including the dummy pattern made of the insulating material layer, the crack CR generated in the outside insulating layer is spread to the display area DA along the dummy pattern made of the insulating material layer.

Figure 6:
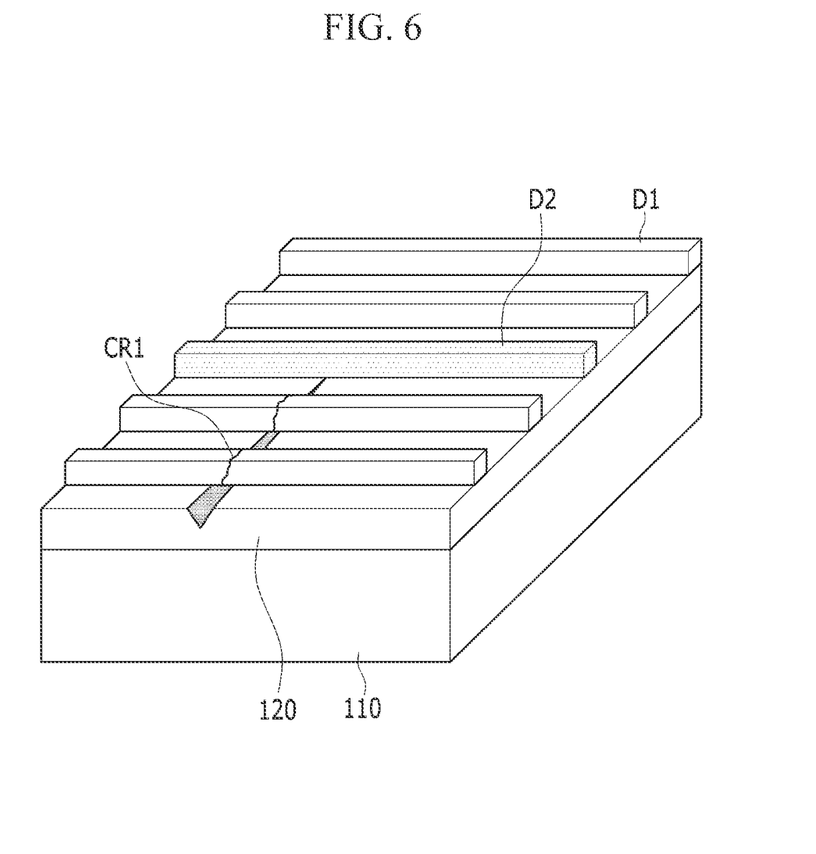
FIG. 6 is a schematic view to explain a characteristic of a display device according to an embodiment.
Figure 7:
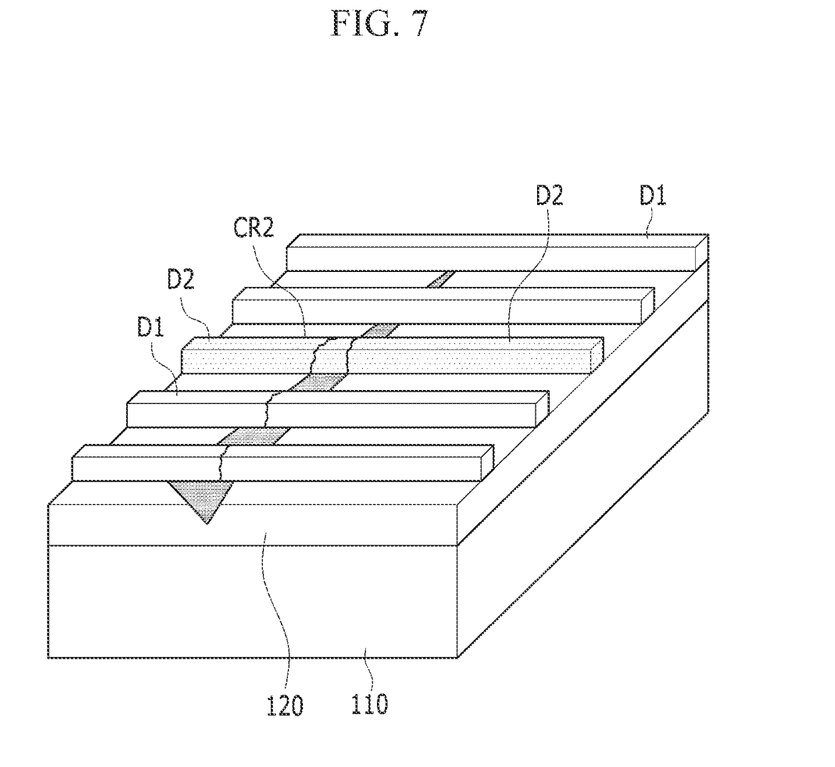
FIG. 7 is a schematic view of a part of a display device according to another embodiment.

Next, a characteristic of the display device according to an embodiment will be described with reference to FIG. 6 and FIG. 7. FIG. 6 and FIG. 7 are schematic views to explain a characteristic of a display device according to an embodiment.

Referring to FIG. 6 and FIG. 7, the externally generated crack CR1 passes through the first pattern D1 made of the insulating material layer and may be spread to the second pattern D2 made of the metal layer, however the crack CR2 of the second pattern D2 made of the metal layer may be easier to recognize than the crack of the first pattern D1 made of the insulating material layer. Accordingly, it may be determined whether the crack is generated in the non-display area NA.

Figure 8:
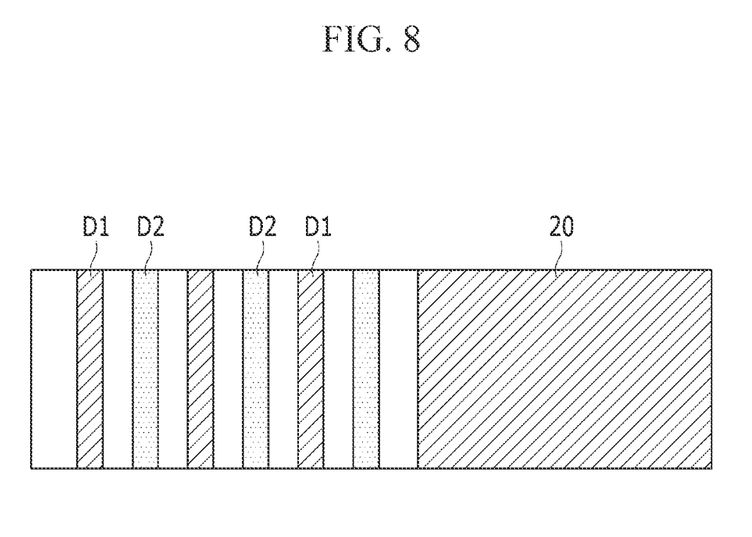
FIG. 8 is a cross-sectional view of a part of the display device of FIG. 7.

Next, the arrangement of the dummy pattern 101 of the display device according to another embodiment will be described with reference to FIG. 8 and FIG. 9. FIG. 8 is a layout view of a part of a display device according to another embodiment, and FIG. 9 is a cross-sectional view of a part of the display device of FIG. 8.

Figure 9:
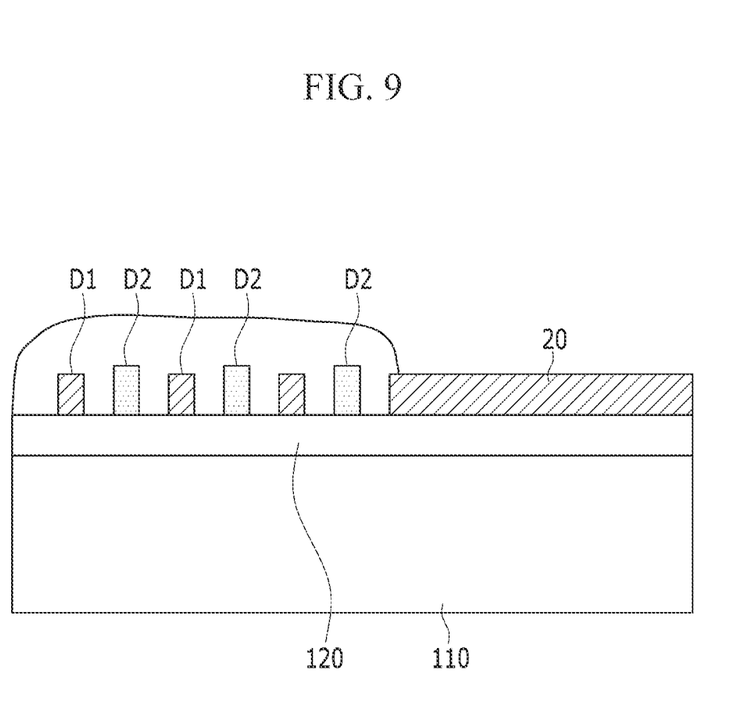
FIG. 9 is a layout view of a part of a display device according to another embodiment.

Referring to FIG. 8 and FIG. 9, the first pattern D1 and the second pattern D2 of the dummy pattern 101 are alternately disposed one by one. In FIG. 8 and FIG. 9, the first pattern D1 and the second pattern D2 are alternately disposed one by one, and according to another embodiment o, a plurality of first patterns D1 and a plurality of second patterns D2 may be alternately disposed.

Thus, the dummy pattern 101 of the display device according to an embodiment includes the first pattern D1 made of the insulating material layer and the second pattern D2 made of the metal layer, and the first pattern D1 and the second pattern D2 are alternately disposed, thereby preventing the externally generated crack CR from being spread to the display area DA.

Figure 10:
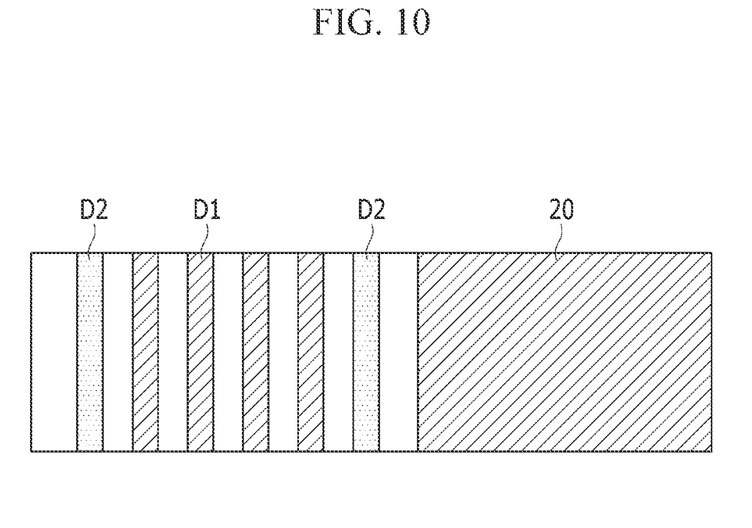
FIG. 10 is a cross-sectional view of a part of the display device of FIG. 9.

Next, the arrangement of the dummy pattern 101 of the display device according to another embodiment will be described with reference to FIG. 10 and FIG. 11. FIG. 10 is a layout view of a part of a display device according to another embodiment, and FIG. 11 is a cross-sectional view of a part of the display device of FIG. 10.

Figure 11:
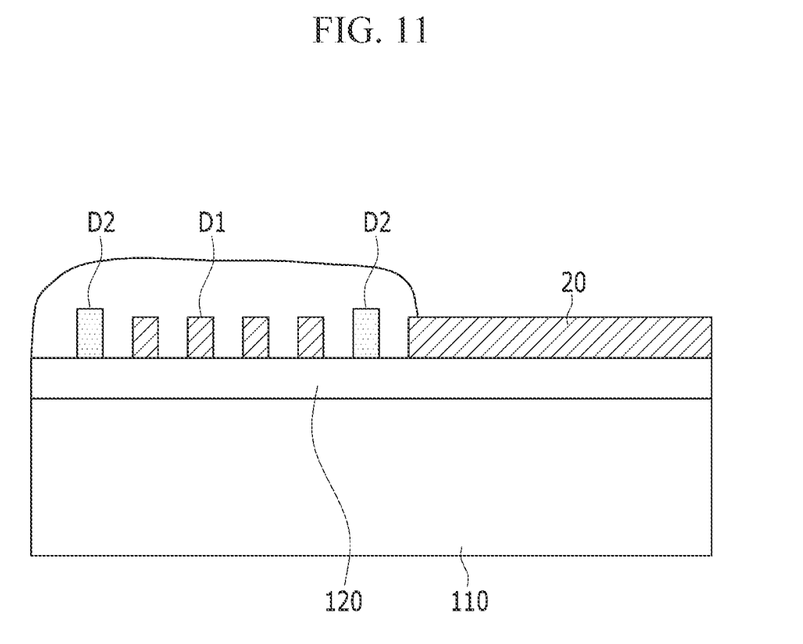
FIG. 11 is a layout view of a part of a display device according to another embodiment.

Referring to FIG. 10 and FIG. 11, the second pattern D2 of the dummy pattern 101 may be disposed one by one at the edge of the non-display area NA, and the plurality of first patterns D1 are disposed between two second patterns D2 disposed at the edge.

That is, according to one embodiment, the second pattern D2 made of the metal layer is disposed at the edge of the region in which the first pattern D1 made of the insulating material layer is disposed.

As described above, the dummy pattern 101 includes the second pattern D2 made of the metal layer at the edge of the region in which the first pattern D1 made of the insulating material layer is disposed, thereby preventing the crack CR generated outside the display device from being spread to the display area DA.

Figure 12:
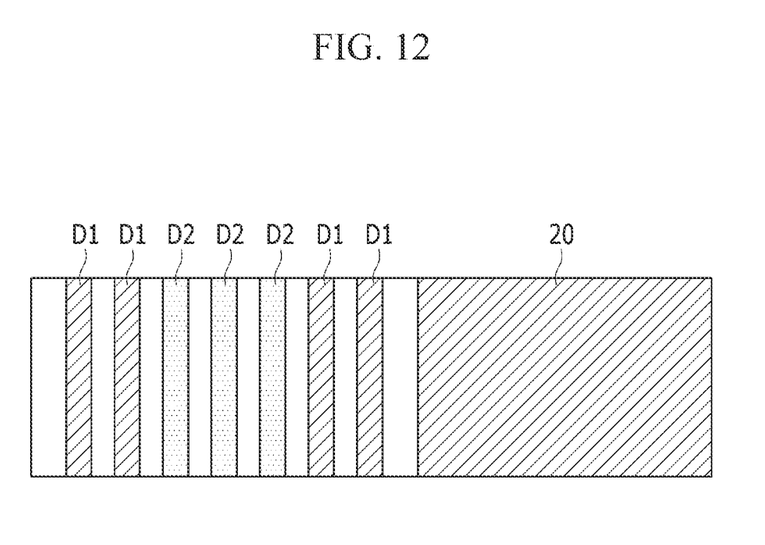
FIG. 12 is a cross-sectional view of a part of the display device of FIG. 11.

Next, the arrangement of the dummy pattern 101 of the display device according to another embodiment will be described with reference to FIG. 12 and FIG. 13. FIG. 12 is a layout view of a part of a display device according to another embodiment, and FIG. 13 is a cross-sectional view of a part of the display device of FIG. 12.

Referring to FIG. 12, the first pattern D1 of the dummy pattern 101 is disposed two by two at the edge of the non-display area NA, and the plurality of second patterns D2 are disposed between the first patterns D2 positioned at the edge.

Thus, the dummy pattern 101 includes the plurality of second patterns D2 made of the metal layer inside the region in which the first pattern D1 made of the insulating material layer is disposed, thereby preventing the crack CR generated outside the display device from being spread to the display area DA.

The display devices according to the above described embodiments may all be a flexible display device or a curved display device.

While this disclosure has been made in connection with certain embodiments, it is to be understood that the invention is not limited to the disclosed embodiments, but, on the contrary, is intended to cover various modifications and equivalent arrangements included within the spirit and scope of the appended claims.

<Description of symbols>

| | |
|---|---|
| DA: display area | NA: non-display area |
| 10: substrate | 120: barrier layer |
| 20: inorganic layer | 201: secondary dummy pattern |
| 21: driving thin film transistor | 24: first insulating layer |
| 26: second insulating layer | 27: passivation layer |
| 28: organic light emitting diode | 29: pixel definition layer |
| 30: thin film encapsulation layer | 101: dummy pattern |
| D1: first pattern | D2: second pattern |
| 211: semiconductor layer | 212: gate electrode |
| 213: source electrode | 214: drain electrode |

<Description of symbols>

| | |
|---|---|
| 281: pixel electrode | 282: organic emission layer |
| 283: common electrode | |

The invention claimed is:

1. A display device, comprising:
   a substrate including a display area where pixels are disposed and a non-display area adjacent to the display area;
   a barrier layer disposed on the substrate;
   a transistor disposed on the barrier layer in the display area and including an active layer, a first electrode, a second electrode, and a third electrode;
   a first insulating layer disposed between the active layer and the first electrode;
   a second insulating layer disposed between the first electrode and the third electrode;
   first patterns disposed in the non-display area and formed of a first same material as one of the first insulating layer and the second insulating layer; and
   second patterns disposed in the non-display area and formed of a second same material as one of the first electrode, the second electrode, and the third electrode,
   wherein the non-display area is disposed between the display area and an edge of the substrate, and
   wherein the first patterns and the second patterns extend parallel to the edge of the substrate.

2. The display device of claim 1, wherein the first patterns and the second patterns are not electrically connected to any of the pixels.

3. The display device of claim 1, wherein intervals between two adjacent first patterns of the first patterns are substantially constant, and intervals between two adjacent second patterns of the second patterns are substantially constant.

4. The display device of claim 1, wherein the first patterns do not overlap the second patterns in a direction perpendicular to a surface of the substrate.

5. The display device of claim 1, wherein heights of the first patterns are different from heights of the second patterns.

6. The display device of claim 1, wherein the display device is flexible or curved.

7. The display device of claim 1, wherein the first patterns and the second patterns are crack prevention layers which prevent a crack generated at the edge of the substrate from spreading to the display area.

8. The display device of claim 1, wherein the first insulating layer and the second insulating layer are formed of an insulating material layer, wherein the first electrode and the third electrode are formed of a metal layer, and wherein a closest to the edge second pattern of the second patterns is disposed further from the edge than a closest to the edge first pattern of the first patterns.

9. The display device of claim 8, wherein the second patterns are crack detection layers which detect crack generation when a crack generated at the edge of the substrate passes through the first patterns and spreads into the second patterns.

10. The display device of claim 1, wherein at least one of the second patterns is disposed between two adjacent first patterns of the first patterns.

11. The display device of claim 1, wherein the first patterns and the second patterns are disposed at both sides of the display area.

12. The display device of claim 1, further comprising:
- a thin film encapsulation layer encapsulating the display area and including at least one inorganic layer and at least one organic layer,
- wherein the first patterns and the second patterns do not overlap the thin film encapsulation layer.

\* \* \* \* \*